United States Patent [19]

Friedl

[11] Patent Number: 4,513,273
[45] Date of Patent: Apr. 23, 1985

[54] TRANSDUCER FOR CURRENT MEASUREMENT

[75] Inventor: Richard Friedl, Brunswick, Fed. Rep. of Germany

[73] Assignee: LGZ Landis & Gyr Zug AG, Zug, Switzerland

[21] Appl. No.: 582,969

[22] Filed: Feb. 23, 1984

[30] Foreign Application Priority Data

Mar. 2, 1983 [CH] Switzerland ............ 1136/83

[51] Int. Cl.³ .................. H01F 27/08; H01F 27/28
[52] U.S. Cl. ............................ 336/55; 324/127; 336/175; 336/221; 336/223
[58] Field of Search ............ 324/105, 127; 336/55, 336/61, 172, 223, 221, 222, 173, 174, 175

[56] References Cited

U.S. PATENT DOCUMENTS 2,831,164  4/1958  Johnson .................... 324/127
3,183,381  5/1965  Brogan .................. 336/223 X
3,268,843  8/1966  Popp ......................... 336/223
4,182,982  1/1980  Wolf et al. .................. 324/127

FOREIGN PATENT DOCUMENTS 537085  6/1973  Switzerland .

Primary Examiner—Thomas J. Kozma
Attorney, Agent, or Firm—Ernest F. Marmorek

[57] ABSTRACT

A transducer for measurement of a current includes a magnetic core, a single U-shaped flat conductor which has two wings, and a crown joining the wings. Each wing has two openings, and the magnetic core passes through the openings. The two wings constitute two conductive branches in thermal contact with one another, and each branch is adapted to carry a component of the current; the current component carried by one branch differs from the current component carried by the other branch. The current components give rise to opposite respective component fluxes in the magnetic core.

11 Claims, 4 Drawing Figures

TRANSDUCER FOR CURRENT MEASUREMENT

BACKGROUND OF THE INVENTION

The invention relates to a measurement transducer for measuring a current, which includes a flat conductor system having at least two conductive tracks in thermal contact with one another, and a magnetic core. The two conductive tracks pass through the magnetic core; each track passes different respective current components, which in turn give rise to opposite respective component fluxes in the magnetic core.

In my U.S. application, Ser. No. 509,447, filed on June 9, 1983, a measurement transducer of this type was proposed, in which the arrangement of a flat conductor forms a so-called reduction winding having two single conductors. Each conductor has a resistance which differs very little from that of the other conductor, and consequently different respective current components are passed through the two conductors, which, in turn, give rise to opposite respective fluxes in a magnetic core. The two single conductors each consist of a flat conductor, and are therefore in close mechanical and thermal contact with one another, so that the two single conductors maintain their resistance ratio to one another even at relatively high conductor temperatures.

In a measurement transducer of a similar type, which has become known from U.S. Pat. No. 2,831,164, issued to Johnson et al, the primary winding consists of a single flat conductor, in which there is formed a slot along a longitudinal direction thereof. Two conductive branches separated from one another by the slot extend at an angle approximately in respective opposite directions, and surround the magnetic core also in respective opposite directions. The two conductive branches or paths are not, however, in thermal contact with one another, and consequently a temperature-independent current distribution is not ensured. Large measurement errors may therefore result, particularly in the case of any high measurement currents.

From U.S. Pat. No. 4,182,982 issued to Wolf et al, there has become known a current sensing transducer, which includes a conductive current divider forming a branch path for conducting a fractional current proportional to a current to be sensed, and being applied through the divider. A compensated transformer includes a primary circuit responsive to the fractional current, and two secondary windings. An amplifier circuit controls the current input to one secondary winding in response to the output of the other secondary winding, so that the flux of the primary circuit is virtually compensated in the core, and the secondary winding current is a measure of the current to be sensed. Wolf et al do not, however, provide a folded, or U-shaped flat conductor, so that an intimate thermal contact between two current-carrying branches is not available, thus causing possible inaccuracies in the current measurement, particularly of large currents.

From Swiss patent No. 537,085, issued to Hentschel et al, there has become known a current transducer for obtaining a voltage proportional to a current to be measured. Like the aforementioned Wolf et al patent, the Hentschel et al patent does not provide a folded, or U-shaped flat conductor, which would permit intimate thermal contact between two current-carrying branches, and the construction disclosed in that reference is therefore subject to inaccuracies similar to those arising in the Wolf et al reference, particularly in the case of large currents.

SUMMARY OF THE INVENTION

It is an object of the invention to devise a measurement transducer of the aforedescribed kind, which has a flat conductor system consisting of a single flat conductor, so that, while thermal contact between both conductive branches is maintained, an electrical connection between two single conductors, which could lead to problems, can be dispensed with.

This object is attained by there being provided a single U-shaped flat conductor which has two wings, and a crown joining the wings, and wherein each wing has two openings, and the magnetic core passes through the openings. The two wings constitute two conductive branches in thermal contact with one another, and each branch is adapted to carry a component of the current. The current component carried by one branch differs from the current component carried by the other branch; these current components give rise to opposite respective component fluxes in the magnetic core.

BRIEF DESCRIPTION OF THE DRAWING

For a fuller understanding of the nature and objects of the invention, reference should be had to the following detailed description, taken in connection with the accompanying drawings, in which:

FIG. 3a is a plan view of one version of a flat conductor obtained from a single metal block without the use of any bending mechanism;

FIG. 3b is a cross-section along line 3b—3b of FIG. 3a; and

DESCRIPTION OF THE PREFERRED EMBODIMENTS

Figure 4:
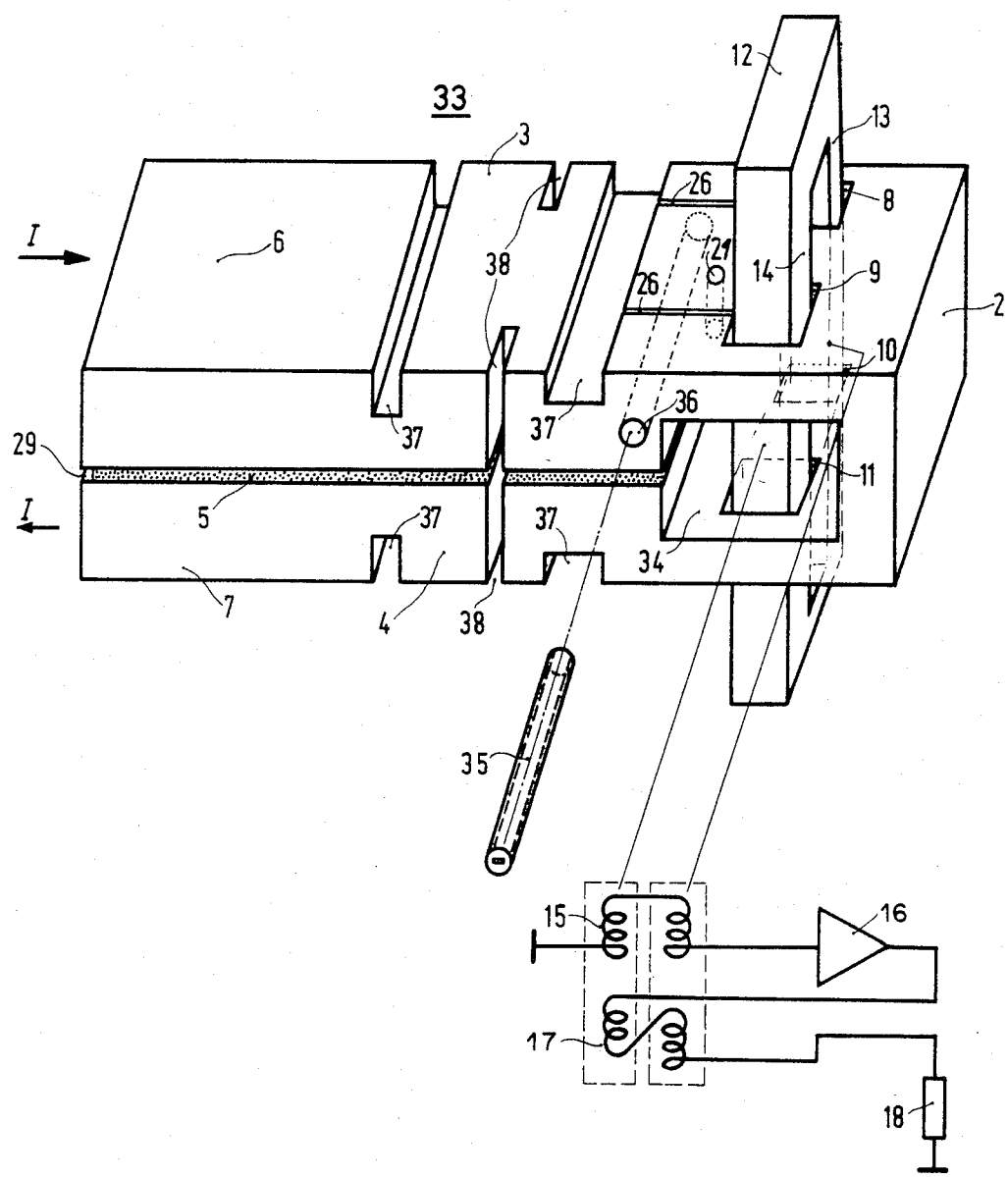
FIG. 4 is a perspective view of another version of a flat conductor obtained in a manner similar to that of the version shown in FIGS. 3a and 3b.

In the drawing there is shown a flat conductor 1 consisting of a single strip of sheet metal, which is U-shaped, or bent back along a crown, such as along a folding or reversing edge 2. In other words, an original flat sheet is bent back by 180°, thus providing the U-shaped cross-section. An upper wing of the folded flat conductor is denoted in the drawing with the reference numeral 3, while a lower wing thereof is denoted with the reference numeral 4. The wings 3 and 4 are electrically insulated from one another by means of a thin insulating layer 5, and are in close thermal contact with one another. Each wing 3 or 4 is provided on a free end thereof with electrical connection means, such as electrical connectors 6 or 7, respectively. The cross-section of the flat conductor 1 is approximately constant for the entire length thereof between the connectors 6 and 7. The current I to be measured passes into, and through the flat conductor 1 by means of the connector 6, and leaves the flat conductor 1 by means of the connector 7. The wing 3 is formed with two openings 8 and 9, and the wing 4 is formed with two openings 10 and 11. These openings are so arranged that following folding of the flat conductor 1 the openings 8 and 10 are aligned with the openings 9 and 11, respectively. A closed magnetic core 12 shown only schematically in the drawing is passed through openings 8 through 11. As best seen in FIG. 4, a first leg 13 of the magnetic core 12 passes through openings 8 and 10, while a second leg 14 of the magnetic core 12 passes through openings 9 and 11.

In the example illustrated the transducer described operates as a so-called active current transducer. For this purpose a detector winding 15 disposed on the magnetic core 12 is connected to the input of an amplifier 16, whose output is connected to a series circuit consisting of a secondary winding 17 and a load 18.

The flat conductor 1 represents the primary winding of a transducer. It will be easily seen that the difference $I_1 - I_2$ of two current components $I_1$ and $I_2$ determines the primary flux of the core 12, and wherein, as can be best seen from FIG. 1, the current component $I_1$ flows in a conductive portion 19 of the wing 3, and the current component $I_2$ flows in a conductor portion 20 of the wing 4.

The wings 3 and 4 of the flat conductor 1 are substantially similar and almost identical, but differ from one another only by a small deviation in shape, which is required so that the current components $I_1$ and $I_2$ also differ in magnitude from one another. For this purpose, in the example illustrated the wing 3 of the flat conductor 1 is provided with a further opening 21 in the vicinity of the openings 8 and 9. This opening results in the resistance of the conductive track 19 lying between the openings 8 and 9 being greater than the resistance of the conductive track 20 lying between the openings 10 and 11, so that the current distribution in the wing 3 differs from that in the wing 4. The difference $I_1 - I_2$ is proportional to the current I to be measured, based on the assumption that the current distribution of the current I to be measured remains constant. Conseqently the primary flux in the magnet core 12 is also proportional to the current I.

Due to the fact that both wings 3 and 4 of the flat conductor 1 are approximately equally formed, and are in close thermal contact with one another, a current distribution independent of the strength of the current I to be measured is ensured in the flat conductor 1, so that a very high degree of measurement accuracy is ensured.

Compensation of the primary flux is accomplished in a known manner by a current flowing in the secondary winding 17, which in turn is controlled in a regulating circuit by the amplifier 16 in such a manner that the voltage induced in the detector winding 15 approaches zero.

The proportionality factor between the current I to be measured and the secondary current i is determined by the magnitude of the asymmetry of the current distribution in the wings 3 and 4 of the flat conductor 1. The required asymmetry can also be achieved by any other measures than by the opening 21, for example by removal of material from the rims of one of the wings 3 and 4 of the flat conductor 1, or by providing for a size of the opening 8, which differs from that of the opening 9.

Advantageously the openings 8 and 9, on one hand, and 10 and 11, on the other hand, of each wing 3 and 4, respectively, as seen in the longitudinal direction of the flat conductor 1, are disposed next to one another, so that these openings subdivide the corresponding wing into three geometrically and electrically parallel conductive paths or tracks 19, 22 and 23, on one hand, and 20, 24, 25, on the other hand, and wherein the center conductive track 19 or 20 passes through the magnetic core 12. This results in a largely symmetrical arrangement, which in turn yields a particularly high measurement accuracy and insensitivity with respect to any external perturbing influences.

Each opening 8 through 11 is advantageously formed by an aperture through which the magnetic core 12 passes, which can, for example, asssume a circular shape, and by a preferably narrow longitudinal slit 26 communicating with the aperture. The longitudinal slits 26 cause the current distribution to stabilize, when the flat conductor 1 is heated, and also cause an increase in the resistance, or decrease in the admittance of the short-circuit loops acting on the magnetic core 12, the short-circuit loops being formed by the respective borders of the openings 8 through 11; this in turn increases the sensitivity of the circuit.

To compensate any error in the phase angle, the conductive path or portion 23 of the wing 3 is advantageously magnetically connected by means of a ferromagnetic element 27 to the adjoining conductive portion 25, the ferromagnetic element 27 being electrically insulated from the conductive portion 23. The element 27 permits a vernier phase equalization, and is preferably implemented as a bracket which may be clamped onto a respective wing.

The folded flat conductor 1 can also be shaped from a suitable casting or by means of an extrusion process. This applies particularly for the manufacture of accurate high-current transducers by means of automatically operating tools.

Figure 1:
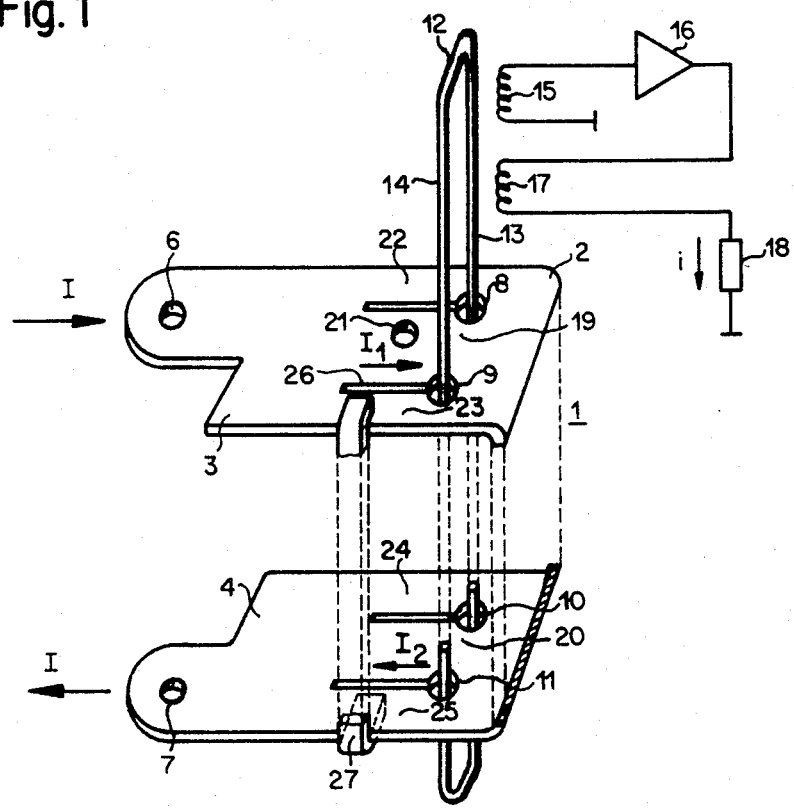
FIG. 1 is a perspective view of the measurement transducer, according to the present invention.
Figure 2:
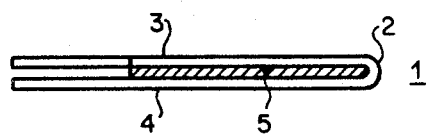
FIG. 2 is a side view of a flat conductor.
Figures 3A, 3B:
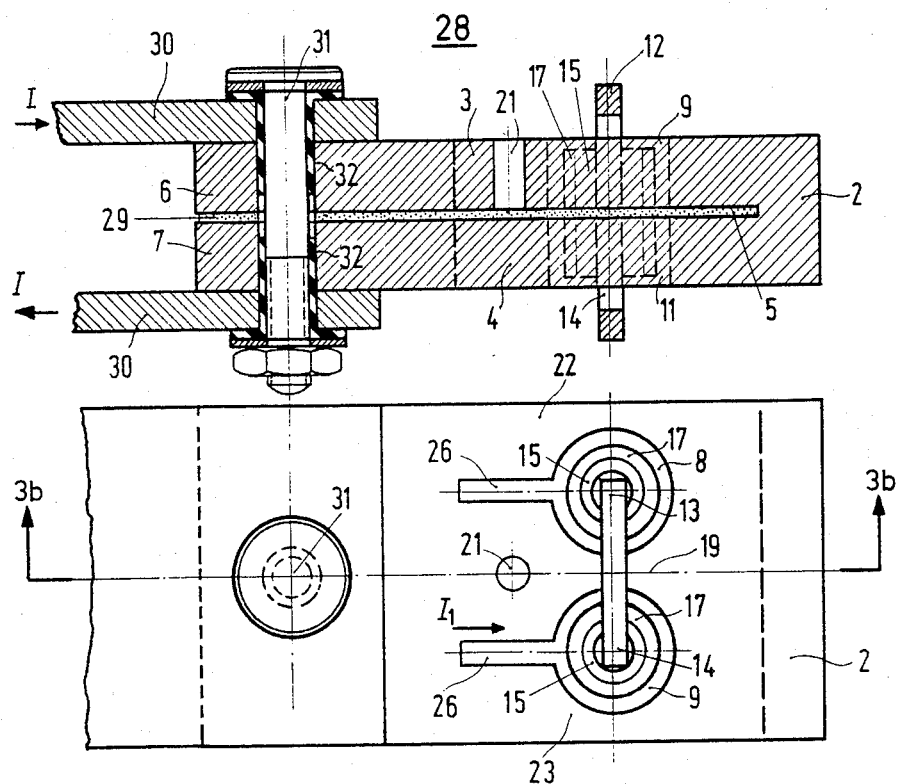

FIG. 3 shows a simple example of a flat conductor 28 manufactured in this manner. Identical, or identically operating parts as shown in FIGS. 1 and 2 are denoted in FIG. 3 with the same reference numerals. The flat conductor 28 has been formed by a well-conducting metal block, which is partitioned by a slit 29 into the wings 3 and 4, and whose shape and manner of operation correspond to that of the folded flat conductor 1 according to FIG. 1. Wings 3 and 4 are connected to one another by the thermally well-conducting electrical insulating layer 5. But both wings 3 and 4 are also superimposed on one another in a mirror-symmetrical manner between the two connectors 6 and 7, and with respect to the folding edge 2, so as to obtain a better heat equalization. Connection to an external circuit is accomplished either by plugging the connectors 6 and 7 into an appropriate matching connector element, or by screwing the connecting leads or strips 30 of the external circuit onto the connectors 6 and 7, respectively, preferably means of a single threaded bolt 31 with a corresponding nut, so that the two connecting strips 30 are clamped onto the respective connectors 6 and 7 at an equal pressure. The threaded bolt 31 is electrically insulated from the current-conducting parts by a suitable insulating sleeve 32.

An aluminum sheet, which has been electrolytically oxidized on each side is suitable as an insulation layer 5 to be inserted as material into the slit 29. In this manner a particularly good heat transfer is ensured between the wings 3 and 4.

The function of the flat conductor 28, according to FIG. 3, corresponds to that of the mechanically folded flat conductor 1 according to FIG. 1. In that arrangement of the primary flat conductor 28 the detector winding 15 and the secondary winding 17 each surround the respective legs 13 and 14 of the closed magnetic core 12, with half the number of turns of the complete winding. The windings 15 and 17 are disposed in the superimposed pairs of openings 8,9, and 10,11 of the wings 3 and 4, respectively. (The opening 10 below the opening 8 is covered in FIG. 3). The same relations apply for the flux of the magnetic core 12 as have been described earlier for the folded flat conductor 1.

FIG. 4 shows a further embodiment of a flat conductor 33 obtained from a casting part or from an extruded or press part, in which the windings 15 and 17 disposed on the magnetic core 12 are surrounded by the wings 3 and 4, and wherein a recess 34, which extends parallel to the crown or reversing ridge 2 is provided for receiving the windings. This arrangement has the advantage that the magnetic field between the wings 3 and 4 is significantly reduced at the locations where the leg or legs 13 and 14 of the magnetic core 12 pass through the wings, so that a local saturation of the magnetic core 12 is largely avoided. Heat equalization between the wings 3 and 4 can again be completed by filling in of the recess 34 with an insulation mass, which conducts heat well. Compared to the flat conductors 1 or 28 (FIG. 1 or FIG. 3, respectively), the openings 8 through 11 serving to receive the magnetic core 12 are rectangular. Additionally, in this arrangement passages 37 and 38 are provided in wings 3 and 4, respectively, for narrowing the cross-section of the respective conductive wing 3 or 4, so as to render the distribution of the current I to be measured in the flat conductor 33 largely independent of any changes in the transfer resistances of the connecting leads to the connectors 6 and 7, respectively, and consequently also largely independent of any different respective current distributions and temperatures prevailing in the connectors 6 and 7.

Furthermore, for the purpose of equalizing any phase angle difference, there is provided a ferromagnetic threaded bolt 35 which, as a result of penetrating up to a selected depth into a (non-illustrated) bore between the wings 3 and 4, or into a bore 36 formed in one of the wings 3 or 4, can so influence the inductive component of the impedance of one of the conductive tracks, that practically no phase difference exists between the total flux passing through the magnetic core 12 and the current I to be measured.

In the measurement transducers described the magnetic relations can optionally be made still more favorable, if the detector winding 15, and the secondary winding 17 are not disposed on the legs 13 and 14, respectively, but are located with one half thereof above, and with the other half thereof below the cross-rod of the magnetic core 12.

The detector winding 15 can be dispensed with, if there is instead disposed at the input of the amplifier 16 a magnetic field sensor, which, for example, measures the magnetic field in an air gap of the magnetic core 12.

The aforedescribed measurement transducer can also be operated as a so-called time-multiplexed transducer according to the teaching of Swiss Patent No. 618,043. In that case elements 15 to 18 are dispensed with, an alternating reference flux is superimposed onto the primary flux of the magnetic core 12 by means of a premagnetization winding, and the zero crossings of the resulting magnetic field are measured by means of a magnetic field sensor disposed in an air gap of the magnetic core 12.

I wish it to be understood that I do not desire to be limited to the exact details of construction shown and described, for obvious modifications will occur to a person skilled in the art.

Having thus described the invention, what I claim as new and desire to be secured by Letters Patent is as follows:

1. A transducer for measurement of a current, comprising in combination
a magnetic core, and
a single U-shaped flat conductor having two wings, and a crown joining said wings, each wing having two openings, said magnetic core passing through said openings,
said two wings constituting two conductive branches in thermal contact with one another, each branch being adapted to carry a component of said current, the current component carried by one branch differing from the current component carried by the other branch, said current components giving rise to opposite respective component fluxes in said magnetic core.

2. The transducer as claimed in claim 1, wherein said two wings are electrically insulated from one another, and wherein said thermal contact is an intimate thermal contact.

3. The transducer as claimed in claim 1, wherein one wing is similar to the other wing, and differs from said other wing only by a deviation in shape, whereby, while the current component carried by said one branch differs from that carried by the other branch, a total current distribution independent of the magnitude of the current to be measured is obtained for a wide range of current magnitudes, resulting in turn in a high current-measurement accuracy.

4. The transducer as claimed in claim 1, wherein said flat conductor is longitudinal, and wherein said openings extend next to one another along the longitudinal direction, so as to sub-divide each wing into two outer tracks, and a center track, said three tracks being geometrically and electrically parallel conductive tracks, and wherein said center track passes through said magnetic core.

5. The transducer as claimed in claim 4, wherein each opening is defined by an aperture and a longitudinal slit communicating with said aperture, said magnetic core passing through said aperture, whereby the current distribution in each wing is stabilized, and the admittance offered to a portion of said current flowing near a corresponding opening is decreased.

6. The transducer as claimed in claim 4, further comprising ferromagnetic means connecting one conductive track of one wing to a neighboring conductive track of one of said wings, so as to equalize any phase error existing between the sum of said component fluxes in said magnetic core and the current to be measured.

7. The transducer as claimed in claim 1, wherein said flat conductor is longitudinal, and is folded in a crown-region thereof along a direction substantially perpendicular to the longitudinal direction.

8. The transducer as claimed in claim 1, wherein said flat conductor is a casting.

9. The transducer as claimed in claim 1, wherein said flat conductor is an extruded part.

10. The transducer as claimed in claim 8 or 9, wherein said flat conductor is longitudinal, and said crown extends in a direction substantially at right angles to the longitudinal direction, said flat conductor having a recess extending parallel to said crown for receiving at least one electrical winding.

11. The transducer as claimed in claim 8 or 9, wherein at least one of said wings has a bore, and further comprising adjustable ferromagnetic means disposed at least partly in said bore, so as to equalize any phase error existing between the sum of said component fluxes in said magnetic core and the current to be measured.

* * * * *